United States Patent [19]

Takeuchi et al.

[11] Patent Number: 4,821,198

[45] Date of Patent: Apr. 11, 1989

[54] APPARATUS FOR READING OUT WORK MACHINING DATA WRITTEN IN A MEMORY MODULE ATTACHED TO A PALLET WHEN THE PALLET IS MOVED TO A MACHINE TOOL

[75] Inventors: Kunihiko Takeuchi, Kawasaki; Masao Oba, Yokohama, both of Japan

[73] Assignee: Tokyo Keiki Company, Ltd., Tokyo, Japan

[21] Appl. No.: 48,632

[22] Filed: May 11, 1987

[30] Foreign Application Priority Data

May 30, 1986 [JP] Japan .............................. 61-125448

[51] Int. Cl.⁴ .............................................. G06F 15/46
[52] U.S. Cl. ...................................... 364/468; 29/568; 364/474.21; 364/478
[58] Field of Search ............... 364/468, 478, 474, 475; 235/375, 376, 383, 385; 414/134–136; 198/349, 350; 29/568; 340/825.23

[56] References Cited

U.S. PATENT DOCUMENTS

| | | | |
|---|---|---|---|
| 3,576,540 | 4/1971 | Fair et al. | 364/474 X |
| 3,889,797 | 6/1975 | Naito et al. | 198/347 |
| 4,237,598 | 12/1980 | Williamson | 364/478 X |
| 4,472,783 | 9/1984 | Johnstone et al. | 364/474 |
| 4,588,880 | 5/1986 | Hesser | 364/478 |
| 4,591,991 | 5/1986 | Sticht | 235/375 X |
| 4,646,245 | 2/1987 | Prodel et al. | 364/468 |
| 4,654,512 | 3/1987 | Gardosi | 364/468 X |

*Primary Examiner*—Joseph Ruggiero
*Attorney, Agent, or Firm*—Wenderoth, Lind & Ponack

[57] ABSTRACT

A memory module is attached to a pallet having at least one workpiece thereon. Machining processing data of the at least one workpiece is written into the memory module of the pallet put on a pallet yard. When the pallet is moved to a machine tool, the work machining processing data stored in the memory module is read out and set into a controller of the machine tool. Data is written into or read out from the memory module in a contactless manner by using induction coupling coils.

8 Claims, 5 Drawing Sheets

APPARATUS FOR READING OUT WORK MACHINING DATA WRITTEN IN A MEMORY MODULE ATTACHED TO A PALLET WHEN THE PALLET IS MOVED TO A MACHINE TOOL

BACKGROUND OF THE INVENTION

The present invention relates to a data processing apparatus of a factory automation system which is used to automatically move and work a workpiece on a pallet more particularly, to a data processing apparatus of a system in which data is automatically read out of a memory module attached to the workpiece pallet and the workpiece is worked and controlled on the basis of this data.

In recent years, in a factory automation system which intends to realize unmanned machining, systems have been put into practical use wherein an automatic tool changer (ATC) which automatically exchanges a working tool and an automatic pallet changer (APC) which automatically exchanges a workpiece attached to the pallet are combined with a machine tool such as a machining center or the like using a numerical control system, and in an unmanned operation at night, for example, a workpiece is attached to the pallet yard, and the pallet having the workpiece is carried to the APC by an unmanned carrying truck and the previously worked pallet is exchanged for this pallet, and the workpieces attached to the pallets prepared in this manner are sequentially automatically worked.

In the automatizing process of such systems, a large-scale host computer provided at the center performs the overall control. For example, in the case of a multi-item mixture production (FMS) in which the working condition of a workpiece differs for every pallet, the workpiece machining data (numerical value control program) in which the working orders and working contents of the pallets differ have been previously set in the host computer. When the host computer detects that a new pallet has been moved to the machining center, the machining data (NC tape data) is transmitted and loaded into the controller of the machining center.

However, the conventional concentrated managing system by the host computer has the following problems.

For example, if one of a plurality of unmanned carrying trucks causes a failure during the operation, the pallet cannot be automatically exchanged in accordance with a predetermined order. Therefore, the operation is stopped if the operator does not take a countermeasure on the host computer side.

On the other hand, when the unmanned operation is performed, the machining data of each workpiece or pallet must be prepared for a number of machine tools provided in the factory. Therefore, in the case of multi-item mixture production, it is very troublesome to feed the machining data into the host computer. Accordingly, although the unmanned operation of the machine tools can be realized, a plurality of operators must always exist to operate the host computer, resulting in a large key point when the system is operated.

SUMMARY OF THE INVENTION

It is an object of the present invention to provide a data processing apparatus of a factory automation system in which by storing the machining data in the pallet itself having a workpiece, the concentrated management by the host computer can be lightened.

Another object of the invention is to provide a data processing apparatus having a high flexibility in which the unmanned operation can be continued even if a special trouble such as failure of an unmanned carrying truck or the like occurs.

Still another object of the invention is to provide a data processing apparatus in which a memory module having a non-volatile memory such as an EEPROM or the like whose content can be rewritten by an electrical signal from the outside is attached to the pallet, thereby allowing the pallet itself to have the machining data.

Still another object of the invention is to provide a data processing apparatus in which the power supply to the memory module and the writing and reading operations of data into and from the memory module can be performed in a contactless fashion.

Still another object of the invention is to provide a data processing apparatus in which the power supply to the memory module and the writing operation of data into the memory module are performed by electromagnetic induction coupling using an induction coil.

Still another object of the invention is to provide a data processing apparatus in which the number of induction coils which are used to supply the power source and to write data into the memory module is reduced.

Still another object of the invention is to provide a data processing apparatus in which data can be transmitted at a high S/N ratio by frequency modulating the transmission signal by use of the induction coil.

Namely, according to present invention, a memory module is provided for a pallet to which one or more workpieces are attached. The machining data obtained from an NC tape is written into the memory module attached to the pallet. A machine tool such as machining center or the like is provided with a write/readout unit. When the pallet is automatically exchanged, the machining data is read out of the memory module and loaded into the controller of the machine tool. The write/readout unit converts the data which was derived from the NC tape into two frequency signals according to the data bits and supplies same to an induction coil for transmission. On the other hand, the write/readout unit receives the frequency modulation signal corresponding to the machining data which was read out of the memory module by the receiving induction coil. The write/readout unit demodulates this signal and loads same into the controller of the machine tool.

The memory module has a receiving induction coil which is arranged so as to face the transmission induction coil of the write/readout unit. The memory module rectifies the frequency signal derived by the induction coil and supplies the power to its internal circuits. The frequency modulation signal derived from the receiving induction coil is demodulated in a data bits and stored into the non-volatile memory such as EEPROM or the like whose contents can be rewritten by an external signal. The data read out of the non-volatile memory is modulated into the frequency signal corresponding to the data bits and is supplied to the transmitting induction coil which is disposed so as to face the receiving induction coil of the write/readout unit and this signal is sent to the write/readout unit side.

The above and other objects, features, and advantages of the present invention will become more apparent from the following detailed description in conjunction with the accompanying drawings.

DETAILED DESCRIPTION OF A PREFERRED EMBODIMENT

Figure 1:
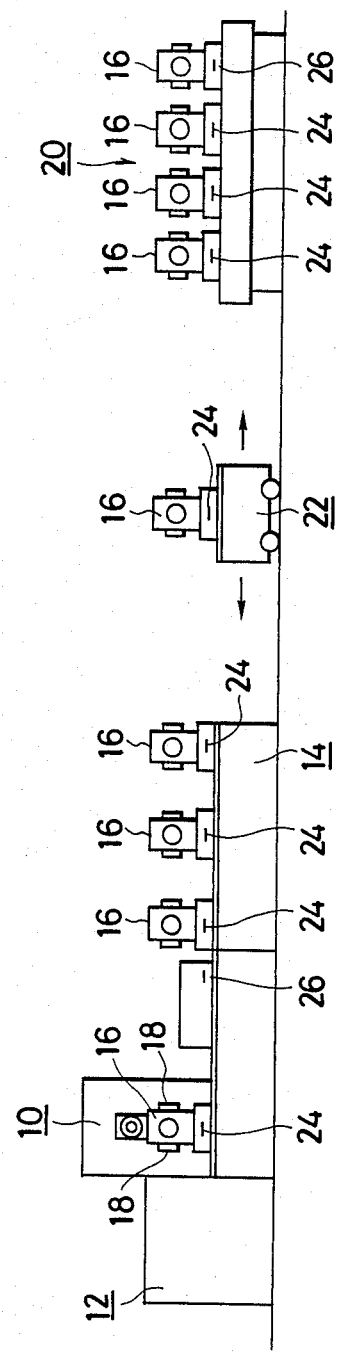
FIG. 1 is a schematic explanatory diagram of an FA system using a data processing apparatus according to the present invention.

FIG. 1 is a schematic explanatory diagram of a system using a data processing apparatus of the present invention.

In FIG. 1, a machining center 10 automatically works a workpiece on the basis of the machining data which is derived from an NC tape. An automatic tool changer (ATC) 12 is disposed on the left side of the machining center 10. Cutting tools such as drill, milling cutter, and the like are previously attached to a holder and prepared in the ATC 12. The necessary tool is selected on the basis of the control of the controller in the machining center 10 and the working tool in the machining center 10 is automatically exchanged to the selected tool by an arm.

An automatic pallet changer (APC) 14 is disposed on the right side of the machining center 10. A plurality of pallets 16 are mounted on the table of the APC 14. After a workpiece 18 attached to the pallet 16 set in the machining center 10 as shown in the diagram was worked, the worked pallet 16 is returned to the APC 14. In place of this pallet, a new pallet 16 to be worked next is moved to the working position of the machining center 10.

Further, in the system of FIG. 1, a pallet yard 20 is disposed at a position away from the machining center 10. A plurality of pallets 16 having workpieces 18 to be worked are prepared on the pallet yard 20. The pallet 16 which had been worked in the machining center 10 and was returned to the APC 14 is then returned to the pallet yard 20 by an unmanned carrying truck 22. The next pallet 16 to be worked is carried to the APC 14 by the truck 22.

In such a system, a memory module 24 in the data processing apparatus of the present invention is attached to each pallet 16. A write/readout unit, which will be explained hereinafter, is further provided in order to write into the memory module 24 of the pallet 16 the machining data, (NC, tape data) corresponding to one or more workpieces attached to the pallet 16 mounted to the pallet yard 20. Further, a coil assembly 26 of another write/readout unit to read out the machining data stored in the memory module 24 of the pallet 16 is disposed at the position where the pallet 16 is inserted from the APC 14 into the machining center 10. The machining data which was read out of the memory module 24 by the coil assembly 26 is loaded into the data memory of the controller of the machining center 10. Namely, the memory module 24 attached to the pallet 16 on the APC 14 which is newly inserted is disposed so as to face within a range of a predetermined gap the coil assembly 26 set on the pallet inserting side of the machining center 10. Thus, the machining data of the memory module 24 is read out by the induction coupling by the coil assembly 26 and loaded into the memory of the controller of the machining center 10.

Figure 2:
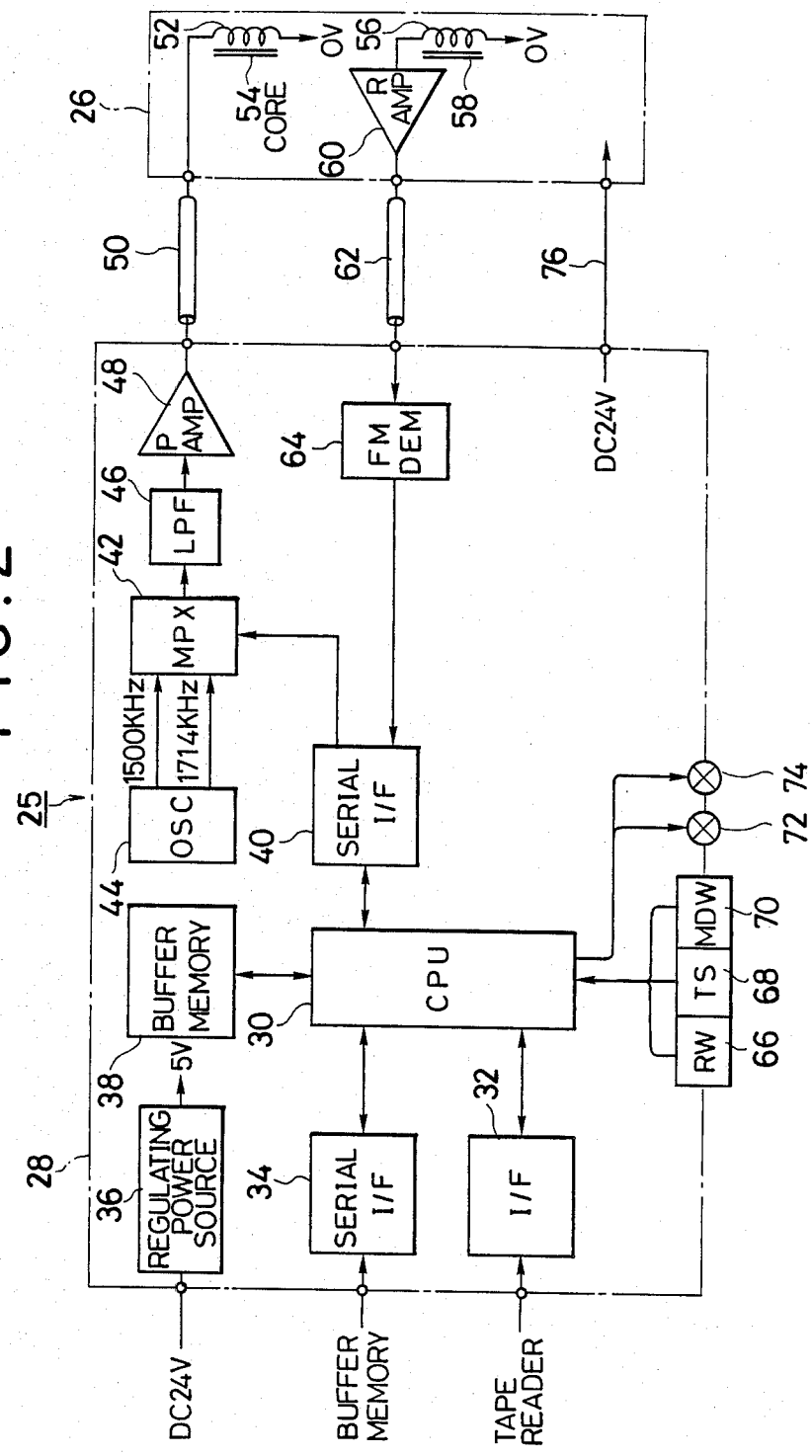
FIG. 2 is a circuit block diagram showing an embodiment of a write/readout unit in the data processing apparatus of the present invention.

FIG. 2 is a circuit block diagram showing an embodiment of the write/readout unit in the data processing apparatus of the invention.

A write/readout unit 25 comprises a unit main body 28 and a coil assembly 26. The coil assembly 26 and the unit main body 28 are connected by two coaxial cables 50 and 62 and by a power source cable 76.

The constitution of the unit main body 28 will now be explained.

A CPU 30 is provided to control the writing and reading operations of the machining data and are connected to a tape reader (not shown) through an interface 32. The CPU 30 is also connected to a buffer memory of the controller of the machining center (not shown) through a serial interface 34. Further, the CPU 30 is connected to a buffer memory 38 to temporarily store the NC data which was input from the tape reader through the interface 32. Namely, when data is written into the memory module 24 from the write/readout unit 25, the data is once stored in the buffer memory 38 by the CPU 30 and thereafter, it is read out and transferred as will be explained in detail hereinafter.

An input/output port (I/O port) of the CPU 30 for the memory module 24 is connected to a serial interface 40. The serial interface 40 converts the parallel data from the CPU 30 into the serial data and converts the serial data from the memory module side into the parallel data.

The data sent out from the CPU 30 through the serial interface 40 is used as a switching signal of a multiplexer 42. Clock frequency signals of 1500 kHz and 1714 kHz are supplied from an oscillator 44 to the multiplexer 42. When the multiplexer 42 receives the data bit "1" from the serial interface 40, the multiplexer 42 selects the clock frequency signal of 1714 kHz from the oscillator 44 and outputs it. When the multiplexer 42 receives the data bit "0" from the serial interface 40, the multiplexer 42 selects the clock frequency signal of 1500 kHz and outputs it. Therefore, frequency modulating means for converting into two different frequency signals corresponding to the data bits "1" and "0" of the data is constituted by the multiplexer 42 and oscillator 44.

The frequency signal of 1714 or 1500 kHz selected by the multiplexer 42 is supplied to a low pass filter (LPF) 46 and converted into a sine wave signal by the LPF 46. The frequency signal converted into the sine wave by the LPF 46 is amplified by a power amplifier 48 and supplied through the coaxial cable 50 to a transmitting induction coil 52 provided for the coil assembly 26. The induction coil 52 is wound around a magnetic core 54.

On the other hand, the coil assembly 26 is provided with a receiving induction coil 56 to receive the frequency signal from the side of the memory module 24 which is derived by the induction coupling, which will be clearly explained hereinafter. The induction coil 56 is wound around a magnetic core 58. The frequency signal derived by the induction coil 56 is amplified by a high frequency amplifier 60 and supplied through the coaxial cable 62 to a frequency demodulator 64 provided for the unit main body 28. The frequency signal having the frequency of 1865 kHz in the case of the data bit "1" and the frequency 0 in the case of the data bit "0" is sent from the side of the memory module 24.

Therefore, when the frequency demodulator 64 receives the frequency signal of 1865 kHz, the demodulator 64 converts it into the data bit "1" and outputs. When the demodulator 64 receives the frequency signal of the frequency 0, the demodulator 64 converts it into the data bit "0" and supplies to the CPU 30 through the serial interface 40. As a practical example of the frequency demodulator 64 for converting such a frequency signal into the data bit, it is constituted by a band-pass filter, having the center frequency of 1860 kHz and a bandwidth which falls within a range of ±50 kHz and a detection circuit using a diode to detect the output of the band-pass filter, and this demodulator further has a comparator to shape the waveform of the detection output.

On the other hand, an RW switch 66 to select the writing mode or the reading mode, a TS switch 68 to instruct the start of the reading operation of data from the tape reader, and an MDW switch 70 to instruct the writing operation of data into the memory module are connected to the CPU 30. The unit main body 28 is provided with an error indicator 72 and an end indicator 74 to indicate the normal end of the writing and reading operations.

Figure 3:
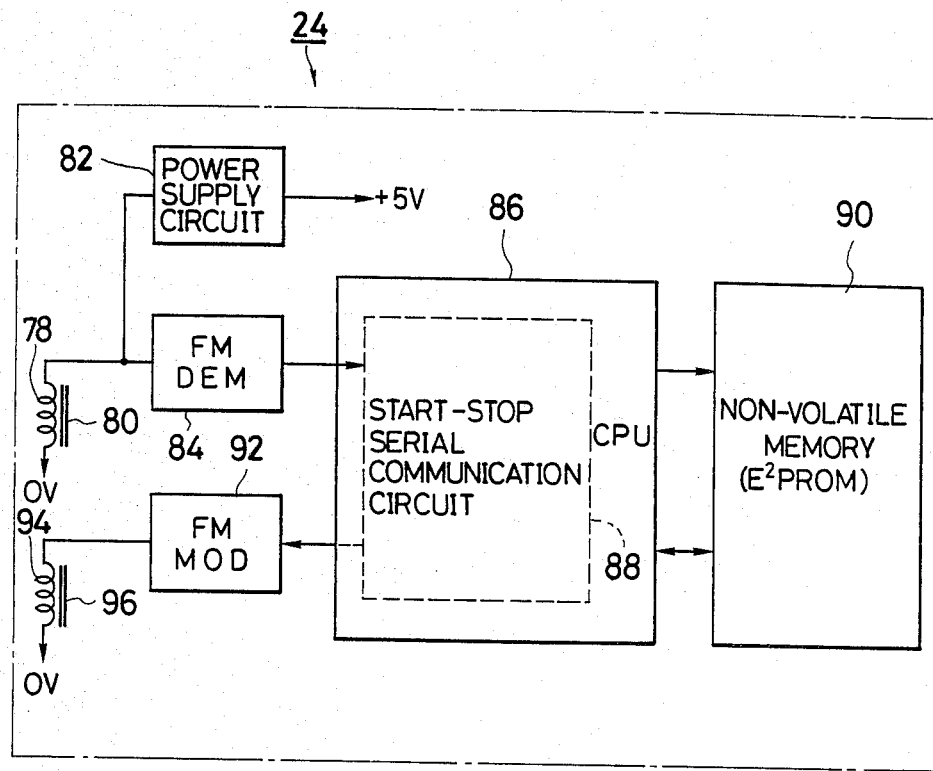
FIG. 3 is a circuit block diagram showing an embodiment of a memory module in the data processing apparatus of the present invention.

FIG. 3 is a circuit block diagram showing an embodiment of the memory module 24 which is attached to the pallet 16 having a workpiece shown in FIG. 1.

The memory module 24 has a power source and an induction coil 78 to receive the signal. The induction coil 78 is wound around a magnetic core 80. The induction coil 78 is disposed so as to face the induction coil 54 for transmission in the coil assembly 26 on the side of the write/readout unit 25 shown in FIG. 2. The frequency modulation signal consisting of a combination of the frequencies of 1500 kHz and 1714 kHz is induced by the electromagnetic induction coupling. The output of the induction coil 78 is given to a power supply circuit 82. By rectifying the frequency signal consisting of a combination of the frequencies 1500 kHz and 1714 kHz, the power source voltage +5 V which is used for the circuits in the memory module 24 is produced. On the other hand, the output of the induction coil 78 is fed to a frequency demodulator 84 and two frequency signals are converted into the data bits "1" and "0". Practically speaking, the frequency demodulator 84 for converting the two frequency signals into the data bits comprises a band-pass filter having the center frequency of 1714 kHz and a bandwidth which falls within a range of ±50 kHz and a detection circuit using a PIN diode or the like to detect the output of the band-pass filter. When the frequency demodulator 84 receives the frequency signal of 1714 kHz, it outputs the data bit "1". When the demodulator 84 receives the frequency signal of 1500 kHz, it outputs the data bit "0".

The data signal demodulated by the demodulator 84 is supplied to a CPU 86. The CPU 86 has therein a start-stop serial communication circuit 88 as shown by broken lines. The CPU 86 performs the serial data transmission while synchronizing the signal with the unit main body 28 shown in FIG. 2 on the basis, of the start-stop synchronizing system. A one-chip type CPU is used as a CPU 86 and the ROM and RAM are assembled in the same chip.

A non-volatile memory 90 to store the machining data is connected to the CPU 86. As the non-volatile memory 90, for example, an EEPROM (electrically erasable programmable read only memory) in which the data can be electrically rewritten by an external signal may be used. Further, the non-volatile memory of the CMOS type is used to reduce the electric power consumption. The memory 90 can write or read out the data into or from the address which is designated by the CPU 86.

The machining data read out of the non-volatile memory 90 by the CPU 86 is converted into the serial data under control of the start-stop serial communication circuit 88 and is fed to a frequency modulator 92. When the frequency modulator 92 receives the data bit "1" from the CPU 86, it outputs the frequency signal of 1865 kHz. When the modulator 92 receives the data bit "0", it stops the generation of the frequency signal. Practically speaking, the frequency modulator 92 comprises an oscillator having the oscillating frequency of 1865 kHz and an AND gate to AND the oscillation output and the data bit from the CPU 86. Thus, with respect to the readout data, the data bit "1" corresponds to the frequency signal of 1865 kHz and the data bit "0" corresponds to the signal of the frequency 0.

The output of the frequency modulator 92 is supplied to a transmitting induction coil 94 wound around a magnetic core 96. The induction coil 94 is disposed so as to face the induction coil 56 provided in the coil assembly 26 in FIG. 2. The induction coil 94 induces the frequency signal in the induction coil 56 of the coil assembly 26 on the side of the write/readout unit 25 due to the magnetic field generated from the induction coil 94 by the frequency signal. The data read out of the non-volatile memory 90 is transmitted to the write/readout unit 25.

The coil assembly 26 shown in FIG. 2 is enclosed in the casing made of a ferromagnetic material or of a non-magnetic material such as aluminum, plastic, or the like. The pole surfaces of the magnetic cores 54 and 58 of the induction coils 52 and 56 are exposed in front of the casing. By allowing signal currents to flow through the coils, the magnetic field can be generated outside of the magnetic pole surfaces of the magnetic cores 54 and 58. In the case of the casing made of a non-magnetic material, there is no need to expose the magnetic cores 54 and 58.

The memory module 24 in FIG. 3 has a package structure such that not only the induction coils 78 and 94 which were respectively wound around the magnetic cores 80 and 96 but also all of the circuit sections including the CPU 86 and non-volatile memory 90 are enclosed in the casing made of a ferromagnetic material or a non-magnetic material.

The operation to write the NC tape data into the memory module 24 by the write/readout unit 25 will now be explained with reference to a flowchart of FIG. 4.

In the system shown in FIG. 1, the writing operation is performed in the state such that the coil assembly 12 of the write/readout unit 25 shown in FIG. 2 faces the memory module 24 attached to the pallet 16 put on the pallet yard 20 so that both induction coils face each other.

First, the operator sets the RW switch 31 of the unit main body 25 in FIG. 2 into the writing mode. As shown in the discriminating step 100, the CPU 30 determines whether or not the writing mode has been set. As shown in the next step 102, when the NC tape is set into the tape reader connected to the unit main body 28, a set signal is generated and the next discriminating step 104 follows. In step 104, the CPU 30 determines if the TS switch 68 has been turned on or off. When the TS switch 68 is turned on, the NC tape data is read out by the tape reader. In step 106, the data read out of the NC tape is written into the buffer memory 38. After the tape data was stored into the buffer memory 38, the CPU 30 checks whether or not the MDW switch 70 has been turned on in step 108. If YES, step 110 follows and the data written in the buffer memory 38 is read out and written into the non-volatile memory 90 of the memory module 24 through the induction coil 52.

Namely, the data read out of the buffer memory 38 by the CPU 30 is converted into the serial data by the serial interface 40 and is fed, as a switching signal to the multiplexer 42. When the data bit is "1", the multiplexer 42 selects and outputs the clock frequency signal of 1714 kHz from the oscillator 44. When the data bit is "0", the multiplexer 42 selects and outputs the clock frequency signal of 1500 kHz from the oscillator 44. Thus, the stored data is converted into the frequency signal consisting of a combination of two different frequencies of 1714 kHz and 1500 kHz. The frequency signal from the multiplexer 42 is converted into the sine wave signal by the low pass filter 46 and amplified by the power amplifier 48. Thereafter, the amplified signal is supplied through the coaxial cable 50 to the induction coil 52 of the coil assembly 26, so that the external magnetic field corresponding to the frequency signal is generated. The magnetic core 80 of the induction coil 78 provided in the memory module 24 in FIG. 3 is arranged so as to face the magnetic core 54 of the induction coil 52 through a predetermined gap. Therefore, the signal corresponding to the external magnetic field by the induction coil 52 is generated in the induction coil 78 of the memory module 24. The frequency signal induced in the induction coil 78 is rectified by the power supply circuit 82 and supplied as a power source voltage of +5 V to each circuit section in the memory module 24, so that the circuits in the memory module 24 are made operative. At the same time, the frequency signal induced in the induction coil 78 is converted into the data bit of "1" or "0" by the frequency demodulator 84 and supplied to the CPU 86. The tape data is written into a predetermined address in the memory 90.

Figure 4:
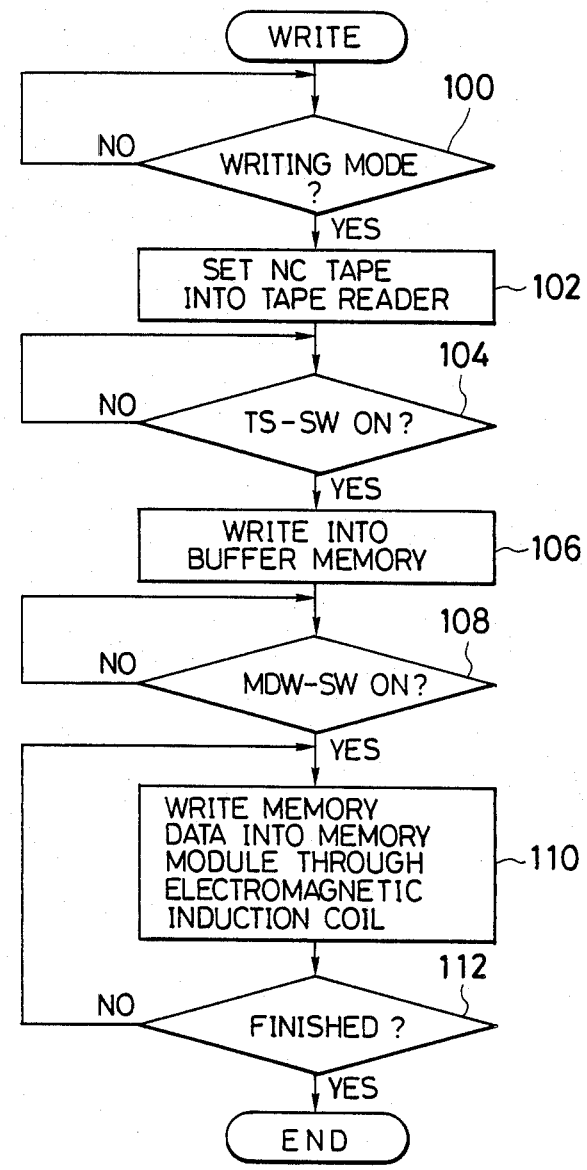
FIG. 4 is a flowchart showing the writing operation in the invention.

In step 112, a determination is made as to whether or not the data has been written into the memory module in step 110 in FIG. 4. When the CPU 30 detects the completion of the storage of the data, the CPU 30 finishes a series of writing processes and lights on the end indicator 74 provided for the unit main body 28.

When the data is written into the memory module in step 110 in FIG. 4, the CPU 30 first sends to the memory module 24 a confirmation signal to confirm that both induction coils are sufficiently electromagnetically coupled. In response to this confirmation signal, the memory module 24 sends a confirmation response signal. When the CPU 30 can correctly receive the confirmation response signal from the memory module 24, the CPU 30 determines that the induction coils are normally electromagnetically coupled and reads out the tape data from the buffer memory 38 and transfers to the memory module 24. If the confirmation response signal cannot be normally received from the memory module 24, the CPU 30 again sends the confirmation signal to the memory module 24. If the CPU 30 cannot receive the confirmation response signal from the memory module 24 even after the confirmation signal was sent a predetermined number of times, e.g., five times, the CPU 30 decides that the induction coupling coils are defectively set, so that the CPU 30 turns on the error indicator 72.

Further, when the CPU 30 transfers the data from the buffer memory 38 after the electromagnetic coupling state of the induction coupling coils was checked, the CPU 30 transfers the serial data, for example, on a 32-byte unit basis. The data of 32 bytes is received in the memory module 24 and the CPU 86 checks whether or not the data includes an error. If the data is correct, the CPU 86 writes the reception data into the non-volatile memory 90. If the CPU 86 detects an error in the data, the CPU 86 requests for the write/readout unit 25 to send the data again. If the normal data cannot be received even after the resending operation was requested a predetermined number of times, the CPU 30 of the write/readout unit 25 turns on the error indicator 72, thereby instructing the checking by the operator.

The operation to read out the data from the memory module 24 will now be explained with reference to the flowchart of FIG. 5.

The operation to read out the data from the memory module 24 is performed in the following state. For example, in the system shown in FIG. 1, when the new pallet 16 is taken out from the automatic pallet changer 14 and moved to the machining center 10, the memory module 24 of the pallet 16 is arranged so as to face the coil assembly 26, with a predetermined gap, which was attached to the pallet leading side of the machining center 10.

Figure 5:
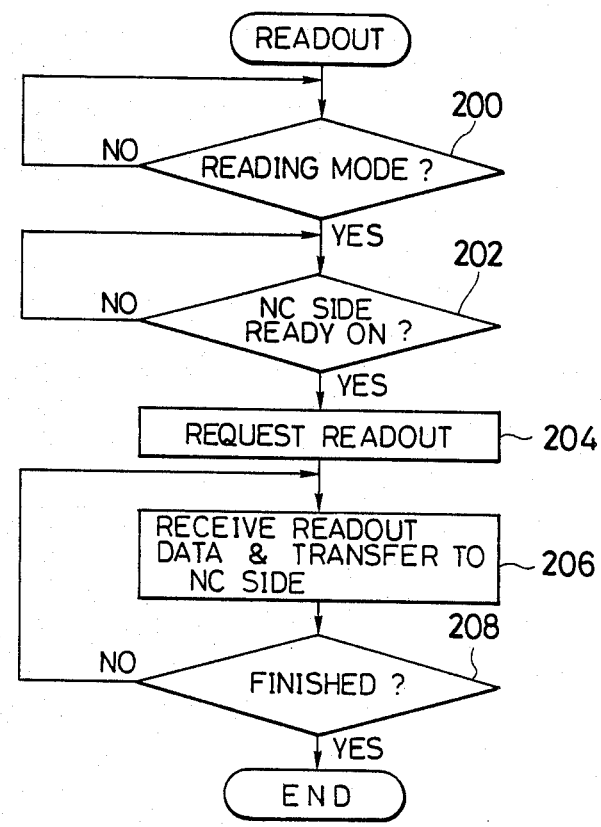
FIG. 5 is a flowchart showing the reading operation in the invention.

In FIG. 5, first, the RW switch 66 provided for the unit main body 28 of the write/readout unit 25 in FIG. 2 disposed on the side of the machining center 10 is set into the reading mode. When the CPU 30 detects in discriminating step 200 that the reading mode has been set, step 202 follows. In step 202, a determination is made to see whether or not the controller of the machining center 10 on the NC side has been set into the ready-on (standby) state to read the data. If YES, step 204 follows and the CPU 30 of the write/readout unit 25 requests for the readout of the data from the memory module 24. When the CPU 86 of the memory module 24 receives the request for the data readout, the CPU 86 reads out the data stored in the memory 90 in step 206. This data is converted into the frequency signal of 1860 kHz by the frequency modulator 92 when the data bit is "1". When the data bit is "0", this data is converted into the signal of the frequency 0. The frequency signal converted in this manner is supplied to the induction coil 94. The frequency signal corresponding to the readout data is induced in the induction coil 56 of the coil assembly 26 shown in FIG. 2 which was disposed on the pallet leading side of the machining center 10. This frequency signal is amplified by the high frequency amplifier 60 and then supplied through the coaxial cable 62 to the frequency demodulator 64 of the unit main body 28 and is again converted into the serial data bits of "1" and "0". The serial data bits are converted into the parallel data by the serial interface 40 and given to the CPU 30. When the CPU 30 receives the data of, e.g., 32 bytes, it converts the parallel data into the serial data through the serial interface 34. The readout data is transferred and loaded into the buffer memory provided for the controller of the machining center 10.

The reception of the readout data and the completion of the data transfer to the NC side in step 206 are discriminated in step 208. When the CPU 30 detects that the transferred data has been loaded into the machining center side, the end indicator 74 provided for the unit main body 28 is turned on and the data reading operation is finished.

Prior to requesting the readout of the data from the memory module 24 shown in step 204 in FIG. 5, the CPU 30 first sends a confirmation signal to the memory module 24 and checks to see whether or not the confirmation response signal has been sent from the memory module 24, thereby checking whether or not the induction coils are correctly electromagnetically coupled. If the normal confirmation response signal was received, the processing routine advances to step 208 and the data is read out of the memory module 24.

Further, when the data is read out in step 206, the CPU 30 checks whether an error is included in the readout data which was transmitted, for example, on a 32-byte unit basis. When an error is detected, the CPU 30 supplies the resending request to the memory module 24. If an error is detected even after the resending request was supplied a designated number of times, the CPU 30 determines that the data cannot be read out and turns on the error indicator 72.

Further, when the data is read out of the memory module 24 in the case where the pallet 16 is moved to the machining center 10, if the electromagnetic coupling of the induction coils is defective or if an error is detected in the data which is transferred on a 32-byte unit basis, this pallet is determined to be a defective pallet. The moving of the defective pallet 16 to the machining center 10 is inhibited. Only the pallet whose data can be correctly read out is moved to the machining center 10 and the workpiece is automatically worked.

As described above, according to the present invention, the pallet itself having one or more workpieces which is moved to the machine tool such as machining center or the like by the automatic pallet changer has the machining data to work the workpieces. Therefore, the host computer does not need to load the machining data to the machining center. For example, even if the machining condition differs for every workpiece every pallet, the pallet itself has the machining data corresponding to the machining condition. Thus, the load of the host computer in the other-item mixture production (FSM) can be remarkably reduced.

On the other hand, even if the unmanned carrying truck to carry the pallet to be worked to the automatic pallet changer on the machining center or the like causes a failure, in the case where the pallet can be carried and set by use of the other normal operative unmanned carrying truck, what is called an unmanned operation can be continued without changing the control procedure of the machining center by the host computer because the pallet itself has the machining data.

Furthermore, since the memory module attached to each pallet does not have a battery, the durability and reliability of the pallet are much higher than those of the battery built-in type pallet. For example, when the EEPROM is used as a non-volatile memory of the memory module, the memory data which has once been written can be guaranteed for many years. Therefore, if there is no need to rewrite the machining data, the workpiece can be worked using the same pallet for many years. Furthermore, in the case of the EEPROM, data can be rewritten more than ten thousand times. Therefore, even if the machining condition of the workpiece is changed, the machining data can be rewritten and the production and working can be continued using the same memory module for a long period of time without considering the number of times that the memory module is used.

Moreover, the transmission and reception of the signal between the write/readout unit and the memory module are performed by the contactless electromagnetic coupling system by way of the induction coils. Therefore, the machining data can be written and read out by merely arranging the coil assemblies of the memory module and write/readout unit so as to face each other by use of the positioning accuracy which the FA system itself has. The invention can be extremely easily applied to existing systems.

Furthermore, since the signal is transmitted and received by the induction coils, even if oil, dust, or the like is deposited on the induction coils, the data can be certainly transmitted and received so long as the distance between both induction coils falls within a range of a predetermined gap. The durability and reliability of the electromagnetic coupling system of the invention are higher than those of optical coupling systems or electrical contact coupling systems.

Furthermore, the power supply and the writing of data to the memory module are performed by the electromagnetic induction coupling by converting the data into two different frequency signal corresponding to the data bits of the writing data. By rectifying these two frequency signals indicative of the writing data, the power source voltage of the memory module is produced. Therefore, it is sufficient to provide only one induction coil which is used for transmission and reception of the signal and for the power supply.

What is claimed is:

1. A data processing apparatus of a factory automation system comprising:
   a memory module for storing machining data which is attached to a pallet having at least one workpiece which is automatically moved to a machine tool; and
   a write/readout unit for writing machining data input from an NC storage medium into said memory module and for reading out said machining data stored in said memory module when said pallet is automatically moved to said machine tool and for setting the readout machining data into a controller of said machine tool; wherein said write/readout unit comprises:
   a control means for controlling the writing of said data into said memory module or the reading of said data from said memory module;
   a frequency converting means for converting output data from said control means to said memory module into serial data and thereafter converting said serial data into a frequency multiplexed signal having two different frequencies in response to data bits and for outputting said frequency multiplexed signal;
   an induction coupling transmitting means which is driven by said frequency multiplexed signal output from said frequency converting means;
   an induction coupling receiving means for receiving said frequency multiplexed signal converted from said data from said memory module; and
   a demodulating means for converting said frequency multiplexed signal obtained from said induction coupling receiving means into data and for outputting such data to said control means.

2. A data processing apparatus according to claim 1, wherein said induction coupling transmitting and receiving means are each constituted by winding an induction coil around a magnetic core.

3. A data processing apparatus according to claim 1, wherein said control means has a buffer memory for temporarily storing the writing data to said memory module and for reading out and outputting the writing data stored in said buffer memory on a unit basis of predetermined bytes.

4. A data processing apparatus according to claim 1, wherein said control means sends a confirmation signal to said memory module prior to outputting the writing data and wherein, when a response signal is correctly received from said memory module in response to said confirmation signal, said control means starts outputting the writing data.

5. A data processing apparatus according to claim 4, wherein said control means has an error indicating means for indicating an error in the absence of receipt of said response signal from the memory module in response to said confirmation signal.

6. A data processing apparatus according to claim 1, wherein said memory module comprises:
   another induction coupling receiving means for receiving said frequency multiplexed signal from said write/readout unit;
   a data demodulating means for converting said frequency multiplexed signal obtained from said another induction coupling receiving means into data corresponding to the frequency;
   another control means for interpreting data derived by said data demodulating means and for controlling the writing or reading operation;
   a rewritable non-volatile memory into which or from which the data is written or read out by said another control means;
   a rectifying means for rectifying said frequency multiplexed signal obtained from said another induction coupling receiving means and for supplying power to internal circuits;
   a frequency modulating means for converting data read out of said non-volatile memory by said control means into a frequency signal corresponding to such data; and
   another induction coupling transmitting means for transmitting an output of said frequency modulating means to said write-readout unit.

7. A data processing apparatus according to claim 6, wherein said another magnetic induction coupling transmitting and receiving means are each constituted by winding an induction coil around a magnetic core.

8. A data processing apparatus according to claim 6, wherein said control means comprises:
   a checking means for checking for errors in data derived from said data demodulating means; and
   a means for requesting for said write-readout unit to send said data again when a data error is detected by said checking means.

* * * * *